Nov. 25, 1969 J. W. HORTON ET AL 3,480,830

MULTI-LAYER PN JUNCTION SEMICONDUCTIVE FLYING SPOT GENERATOR

Filed Jan. 13, 1967

INVENTORS
JOHN W. HORTON
ROBERT J. LYNCH

BY Robert E. Sandt

ATTORNEY

United States Patent Office 3,480,830
Patented Nov. 25, 1969

3,480,830
MULTI-LAYER PN JUNCTION SEMICONDUCTIVE FLYING SPOT GENERATOR

John W. Horton, Boston, Mass., and Robert J. Lynch, Endicott, N.Y., assignors to International Business Machines Corporation, Armonk, N.Y., a corporation of New York Filed Jan. 13, 1967, Ser. No. 609,141
Int. Cl. H05b 37/00, 39/00, 41/00
U.S. Cl. 315—169 2 Claims

ABSTRACT OF THE DISCLOSURE

A multi-layer semiconductive device with an electroluminescent overlay produces a flying spot generator when one of the layers is provided with a potential gradient and another layer is provided with a ramp sweep voltage to establish a moving hull-line which divides the device into a conductive volume and a non-conductive voltage to establish a moving null-line which divides the to excite the electro-luminescent layer in accordance with the amplitude of the modulant.

BACKGROUND OF THE INVENTION

This invention relates to solid state flying spot generators, and more particularly to a device wherein an electroluminescent material is excited to emit light, controlled in position and intensity.

DESCRIPTION OF THE PRIOR ART

Prior to the instant invention it has been known to combine a semiconductor with an electroluminescent overlay to cause a selected area to emit light under the influence of an applied AC modulant. U.S. Patent 2,959,681 to R. N. Noyce, for example, employs an electroluminescent phosphor to emit a spot of light under control of horizontal and vertical scanning potentials. In that device the scanning potentials focus the conduction through a small incremental volume by operating the transistor with a negative resistance emitter-to-collector characteristic with an effective alpha greater than unity. This is achieved by forcing sufficient reverse current across the collector junction so that avalanche multiplication of the carriers crossing the collector junction causes the collector current to slightly exceed the emitter current.

In the application of J. W. Horton et al., Ser. No. 279,531, filed May 10, 1963, and assigned to the same assignee as the instant application, a solid state device is disclosed wherein an applied ramp voltage causes the area of conductivity to enlarge progressively across the device to successively apply the photo induced current from each incremental area of photoresponsive junction to a common output line.

SUMMARY

The present invention employs a constant source of minority carriers which are injected into a layer of semiconductive material of variable potential relative to another layer having a potential gradient therein, whereby, by varying the potential, the injected minority carriers may be selectively collected and reinjected through the device in a volume of conductivity varied in accordance with the magnitude of the applied potential. The final collection provides an amplification in the manner of a transistor, so that when an AC modulant is applied, the electroluminescent layer is excited to emit light proportional to the amplitude and frequency of the modulant.

In accordance with the foregoing principle of operation it is an object of this invention to provide a solid state flying spot generator in which the application of controlled potentials divides the solid state device into conducting and non-conducting volumes wherein the conducing volume operates in saturation to be unaffected by an alternating current modulant which is passed only by a small incremental volume which separates the conducting non-conducting volumes to excite an associated segment of the electroluminescent layer to emit light, whose position and intensity are controllable.

The foregoing and other objects, features and advantages of the invention will be apparent from the following more particular description of preferred embodiments of the invention, as illustrated in the accompanying drawings.

Figure 1:
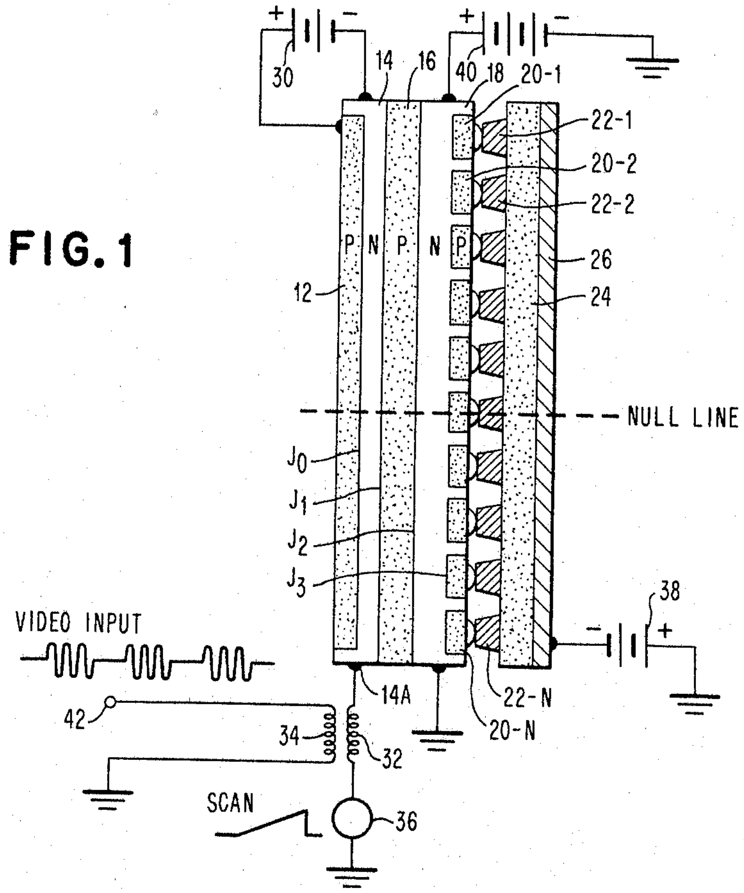
FIG. 1 is a cross-sectional schematic of the preferred embodiment of the device, together with the requisite driving circuits.

The device in FIG. 1, with the structural configuration and applied electrical potentials to be described in detail, is divided into four functional sections; (1) the injector; (2) the scanner; (3) the power amplifier; and (4) the electroluminor. The scanner further divides the device vertically into two regions whose common boundary is conveniently referred to as the null-line, for reasons to be explained. The volume of the device above the null-line is transversely non-conductive, while that below the null-line is transversely conductive. The null-line is vertically positioned by application of a scanning potential. Thus, minority carriers injected by the injector are collected and reinjected by virtue of the appropriate biases on the semiconductive junctions in the scanner section of the device in the conductive region below the null-line. These minority carriers are finally collected to the power amplifier section where they induce a current flow through the associated electroluminor section. This current flow is a direct current which will not cause the electroluminor to be activated. However, when an alternating current modulant is superimposed on the direct current flow, the electroluminor will be activated at the null-line to emit a spot (or line) of light. Since there is no current flow transversely through the device above the null-line, the alternating current modulant is also blocked. The direct current flow below the null-line produces saturation in that region. Therefore, the alternating current modulant does not flow in the region below the null-line. It is only in the region of the null-line where the alternating current modulant is varying the potential between conductivity and non-conductivity in the incremental transverse volume of the device around the null-line that the modulant will pass to excite the electroluminescent layer. Thus, by application of the requisite potential, the null-line may be positioned at any distance along the device, and by controlling the amplitude and time of occurrence of the alternating current modulant, a flying spot generator is produced.

The foregoing functional operation is achieved with the device configuration and bias potentials shown in FIG. 1. The injection of minority carriers is achieved by biasing the P-type semiconductor layer 12 more positively than the N-type layer 14 by battery 30, to produce the forward bias requisite for injection. These minority carriers are generated at a constant rate because the forward bias of the junction $J_0$ is maintained despite variations in the potential of the layer 14. Above the null-line the injected minority carriers recombine because, for reasons to be explained, the second junction $J_1$ is forwardly biased. Below the null-line, in the conductive region, the injected minority carriers are collected and reinjected into the third layer 16 of P-type material.

The production of the null-line and the division of the device into a conductive region and a non-conductive region is effected by varying the potential of the N-layer 14 by applying an ascending ramp voltage thereto by means of the ramp voltage generator 36, the secondary winding 32 and the edge terminal 14A applied to the layer. This ramp voltage changes the potential uniformly throughout the layer 14, while the layer 12 maintains its constant relative potential. Thus junction $J_0$ maintains a constant forward bias. Junction $J_1$, on the other hand, is forward biased above the null-line to inhibit collection of the injected minority carriers and reverse biased below the null-line to achieve collection. This occurs because the layer 18, of N-type semiconductive material has a potential gradient established therein by connection of the positive terminal of battery 40 to the upper edge of the layer 18 and connection of the lower edge of layer 18 to ground, the layer 18 being chosen from a group of N-type materials whose resistivity provides the effect of a voltage divider. The intervening layer 16 is unconnected to any potential source and thus assumes a potential distribution as a function of the relative potentials of the adjacent layers 12 and 18. Initially, with the total device non-conducting, the layer 16 tends to assume the uniform potential distribution of the layer 14. In this condition the total area of the $J_1$ junction is forward biased so that none of the minority carriers injected into the layer 14 is collected at the junction $J_1$. As a result, no conduction takes place in the device. As the potential of the ramp voltage generator begins to increase, the potential level of the N-layer 14 will also increase. The P-layer 16 will initially follow the potential increase of layer 14 until it exceeds the potential of the lowermost incremental area of layer 18 to create a forward bias in junction $J_2$. This creates a situation amenable to the beginning of current flow wherein the volume of the layer 16 below the null-line tends to assume the potential gradient of layer 18 to produce a back-bias in junction $J_1$, and a forward bias in junction $J_2$ below the null-line. This results in the production of the conductive region below the null-line.

Above the null-line the potential of layer 14 remains that of the ramp potential, while that of the layer 16 substantially follows the layer 14. All of the layer 18 above the null-line is at a potential level higher than that of the layer 16, because of the potential gradient in layer 18. Thus the junction $J_2$ above the null-line is back-biased. As the ramp voltage increases the conductive region enlarges and the non-conductive region shrinks, the null-line moving upward in FIG. 1. At the null-line (actually a very small finite area) the conditions are neutral. Because the layer 16 tends to assume the potential gradient of the layer 18 in the conductive region (below the null-line) a current flow parallel to the layer 16 must exist in that layer because of the potential gradient therein. Because the layer 16 tends to assume the uniform potential of the layer 14 in the non-conductive region (above the null-line), it also has a uniform potential distribution therein above the null-line. Thus, no current flows in this layer parallel to the layer above the null-line. At the null-line, the voltage gradient in the layer 16 increases from that of the layer 14 to that of the layer 18, both junctions $J_1$ and $J_2$ may be reverse-biased. The width of this region may be estimated as that needed for both reverse-biased junctions to contribute the current necessary to sustain the voltage gradient in the layer 16 in the conductive region below the null-line. Thus, the current flowing in the layer 16 is a combination of injection current and gradient-establishing current.

Having thus established the capability of producing a positionable null-line which divides the device into a conducting region and a non-conducting region, there remains the exploitation of the current flow to produce the requisite illumination. The next junction in the succession of junctions from left to right in FIG. 1 is actually a plurality of discrete junctions formed by discrete dots 20–1 to 20–N of P-type semiconductor material in the layer 18. Each of these dots, by virtue of the connection of battery 38 provides a plurality of back-biased junctions $J_3$ between the dots and the layer 18, both below, at, and above the null-line. However, since minority carrier injection is inhibited above the null-line, the dots of P-type material in the series 20–1 to 20–N do not collect and therefore do not carry any injection current. The dots below the null-line do collect the minority carriers which were successively injected, collected, and injected across the junctions $J_0$, $J_1$ and $J_2$. These produce injection currents in the dots of the series 20–1 to 20–N below the null-line. At the null-line, in the absence of any alternating current, there is also no injection current because the junction $J_2$ at this incremental area is back-biased, as above explained. To each one of the P-dots 20–1 to 20–N is affixed an ohmic contact 22–1 to 22–N upon which the continuous electroluminescent layer 24 is deposited. This produces an electrically conductive path between each of the dots 20–1 to 20–N and a corresponding plug of the layer 24. The path is completed by a thin transparent conductive layer 26 to which the negative terminal of the battery 38 is connected, the positive terminal being grounded.

With the direct current potentials appropriately applied to the device of FIG. 1 to establish a null-line, conduction proceeds through the device below the null-line, and conduction is blocked above the null-line. At the null-line the device is at the threshold of conductivity. Thus, the electroluminescent layer 24 is non-conducting above the null-line and conducting below the null-line, at least in a series of discrete plugs. This direct current conduction in layer 24 yields no light. However, when an alternating current modulant is superimposed on the direct current ramp, the null-line will be caused to oscillate about the one of the dots 20–1 to 20–N wherein it was positioned by the ramp voltage. This will cause the selected area about the null-line to vary in conductivity to produce an amplified current flow in the selected dot to excite the incremental area of the electroluminescent layer 24 to cause it to emit light. The modulant is applied to the hub 42 as a timed alternating current pulse of controlled amplitude which is coupled via primary 34 of a transformer whose secondary 32 is serially connected to the ramp voltage supply. These AC pulses are timed to coincide with the positioning of the null-line opposite each of the dots 20–1 to 20–N as the null-line scans over the device, the amplitude of the waveform being controlled to produce the desired light output at each incremental area. This is analogous to controlling the grid and deflection voltages in a cathode ray tube.

It is to be noted that the AC modulant is superimposed on the DC ramp voltage. Thus, it might appear that the total conductive region of the device would receive this modulant and thus excite the electroluminescent layer in this area of conductivity. This is not the case. The conductive region goes into saturation so that the addition of the AC to the DC saturating current produces no AC output component to excite the phosphor. It is only in the transition zone at the null-line that the AC is reproduced in the output to excite the phosphor. There is, however, one phenomenon which must receive compensation. This is the pulse effect that results from each of the P-dots becoming successively conductive as the null-line moves across them. This pulse produces a minute excitation of the phosphor and a small flash of light. The level of illumination, however, is so low that it can be overcome either by filtering to absorb, or by controlling the intensity of the ambient illumination to obscure the flash.

Figure 2:
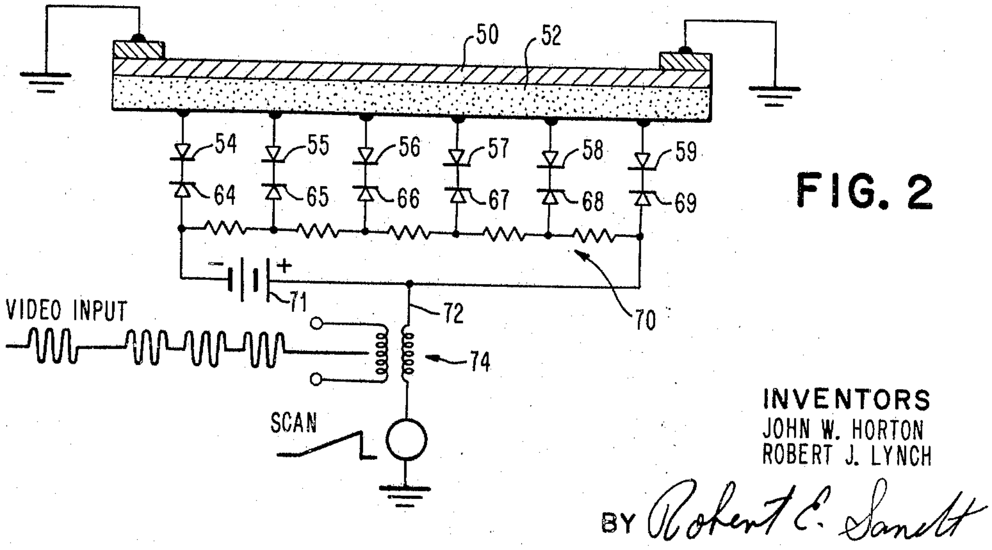
FIG. 2 is a discrete element device without the amplifying feature of the embodiment of FIG. 1.

Before exploring, at least qualitatively, the theory of operation of the device of FIG. 1 it is well to examine the embodiment of FIG. 2 wherein the continuous junctions are broken up into discrete junctions through use of separate semiconductive elements. This embodiment will assist in the understanding of the operation of that of FIG. 1. In FIG. 2 the transparent metal film 50 and the electroluminescent layer 52 are grounded to apply ground potential to the cathodes of each of the diodes 54 through 59. Each of these diodes has its anode connected to the anode of a respective diode in the series 64 through 69, each diode pair being thus connected in opposition. Each of the diodes 64 through 69 has its anode connected to a different tap on the bleeder resistor 70 to which the battery 71 applies a potential difference to the ends thereof. The ramp voltage and AC modulant are applied to the line 72. Since the diodes are in opposition, each pair is current limited by the back conduction of one of the diodes, since there is no transistor action as in the previous embodiment, where minority carriers are injected and collected across the successive forward and reverse biased junctions. Thus the diodes saturate quickly. Since each diode pair is biased to a different potential, through its respective connection to the bleeder 70, each diode pair will operate responsive to a different ramp voltage potential to operate in the zero voltage difference range wherein the slope of the V–I characteristic curve of the composite diodes is a maximum. When each pair of diodes is activated, the AC modulant applied via the coupling transformer 74 causes the diode pair to conduct in the maximum slope region to produce an excitation of the associated incremental areas of the electroluminescent layer 52. The previously activated diode pairs (those activated at a lower ramp potential) are conducting in saturation. Thus the AC modulant, while it is applied to these conducting pairs, does not result in any change in the current through these diodes, and consequently no excitation of the layer 52. Thus, light is emitted only at one pair of diodes at a time as the ramp voltage sweeps the null-line over the device.

Turning now to a qualitative analysis of the relativity of the operation of the embodiments of FIGS. 1 and 2, it will be appreciated that without the amplifying feature of the FIG. 1 embodiment, the embodiment of FIG. 2 is somewhat limited. For example, if the electroluminescent layer 52 requires 5 volts of alternating current excitation then the adjacent diode pairs must be separated by 5 volts on the bleeder 70. Since a PN junction can only sustain a voltage of approximately 100 volts, the maximum bleeder voltage is thus limited. This then limits the number of diode pairs to about twenty which, if spaced at about 15 mils, limits the size of the device to about three tenths of an inch. The embodiment of FIG. 1, on the other hand, is not so limited. Because of the power amplification of the collector junctions, the diodes may be separated by .1 volt to achieve the requisite 5 volt AC excitation of the electroluminescent layer. For a practical configuration the voltage separation is preferably .5 volt. This then yields for a ½" long device with 33 dots having a 15 mil spacing, a maximum ramp voltage of approximately 17 volts. Other exemplary parameters of the device and circuit include a −100 volt potential of battery 38 and a +50 volt potential of battery 40. Except for the P layer 12 which is purposely made thick (about 15 mils) for mechanical rigidity the remaining semiconducting layers are made thin (about ½ mil) so that the holes are not lost by recombination. The width of the device is made sufficient to support a battery voltage of 50 volts without breakdown. This width in fact, if sufficiently large, can produce a line of light, rather than a spot. With semiconductive materials, such as silicon, these material thicknesses are consistent with maximum distance before recombination occurs.

From the foregoing description it will be apparent that the application of an increasing ramp scanning voltage produces an ever-increasing area of conduction through the devices of both embodiments. This area, except at its limit (the null-line) is conducting in saturation, so that the alternating current modulant affects only the region around the null-line. Thus, by choosing the amplitude of modulant and the time of its application relative to the ramp sweep voltage a flying spot of controlled intensity and position results.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A solid state flying spot generator comprising:

(a) a multi-layer semiconductive device fabricated of four continuous layers of alternating conductivity type semiconductor materials and a fifth layer of semiconductor material of a conductivity type opposite to that of said fourth layer, the said layers being joined to form semiconductive junctions therebetween;

(b) an electroluminescent layer electrically bonded to said semiconductor material of said fifth layer;

(c) means connected to said first and second layers for forwardly biasing the junction between the first and second of said four continuous layers;

(d) means connected to said fourth layer for establising a fixed potential gradient in said fourth layer, the said gradient varying along the length of the layer;

(e) means connected to said second layer for producing a uniform potential in said second layer varying linearly as a function of time;

(f) a source of reference potential connected to said electroluminescent layer for establishing a conducting path through said semiconducting device and said electroluminescent layer;

(g) and means connected to said second semiconductive layer for superimposing an alternating current modulant to said conducting path, the amplitude and timing of which is synchronized with the variations in said potential in said second layer, whereby the variations in potential in said second layer divides the device longitudinally into a saturated conducting region and a non-conducting region separated by a narrow transition zone, which zone provides an amplified path for passage of the alternating current modulant through the device to excite a narrow zone of said electroluminescent material to produce light, whose position is controlled by the magnitude of the potential level in said second layer and whose intensity is controlled by the amplitude of the alternating current modulant.

2. The flying spot generator of claim 1 wherein said fifth layer of semiconductor material is a pluarlity of discrete non-continuous bodies of material joined to said fourth continuous layer of semiconductor material to form a plurality of discrete junctions and wherein said electroluminescent layer has discrete areas thereof electrically bonded to correspondingly orientated ones of said discrete bodies of said fifth layer.

References Cited

UNITED STATES PATENTS

| | | | |
|---|---|---|---|
| 2,959,681 | 11/1960 | Noyce | 250—211 |
| 3,400,273 | 9/1968 | Horton | 250—211 |
| 3,400,271 | 9/1968 | Dym | 250—211 |
| 3,270,235 | 8/1966 | Loebner | 313—108 |
| 3,343,002 | 9/1967 | Ragland | 307—88.5 |
| 3,400,272 | 9/1968 | Dym | 250—211 |
| 3,317,733 | 5/1967 | Horton | 250—211 |

JOHN W. HUCKERT, Primary Examiner

B. ESTRIN, Assistant Examiner

U.S. Cl. X.R.

250—211; 307—299, 303; 317—235